(12) United States Patent
Xue et al.

(10) Patent No.: US 8,283,212 B2
(45) Date of Patent: Oct. 9, 2012

(54) METHOD OF MAKING A COPPER WIRE BOND PACKAGE

(75) Inventors: Yan Xun Xue, Los Gatos, CA (US); Jun Lu, San Jose, CA (US); Anup Bhalla, Santa Clara, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 12/980,309

(22) Filed: Dec. 28, 2010

(65) Prior Publication Data

US 2012/0164794 A1    Jun. 28, 2012

(51) Int. Cl.
*H01L 21/00* (2006.01)
*H01L 21/60* (2006.01)

(52) U.S. Cl. ............... 438/123; 257/E21.506

(58) Field of Classification Search ........... 438/111, 438/112, 123, 670, 672, 674, 669, 124; 257/670, 257/672, 674, 669, E21.506, E21.502
See application file for complete search history.

(56) References Cited

U.S. PATENT DOCUMENTS

| | | | |
|---|---|---|---|
| 2008/0290484 A1* | 11/2008 | Low et al. | 257/675 |
| 2009/0057869 A1* | 3/2009 | Hebert et al. | 257/691 |
| 2009/0258458 A1* | 10/2009 | Zhang et al. | 438/107 |
| 2010/0311208 A1* | 12/2010 | Sirinorakul et al. | 438/113 |

* cited by examiner

*Primary Examiner* — William D Coleman
*Assistant Examiner* — Christine Enad
(74) *Attorney, Agent, or Firm* — Chein-Hwa Tsao; CH Emily LLC

(57) ABSTRACT

A method for making a wire bond package comprising the step of providing a lead frame array comprising a plurality of lead frame units therein, each lead frame unit comprises a first die pad and a second die pad each having a plurality of tie bars connected to the lead frame array, a plurality of reinforced bars interconnecting the first and second die pads; the reinforced bars are removed after molding compound encapsulation.

12 Claims, 5 Drawing Sheets

METHOD OF MAKING A COPPER WIRE BOND PACKAGE

BACKGROUND OF THE INVENTION

1. Technical Field

The present invention relates to a method of making a semiconductor package, and more especially, to a method of making multi-chip copper wire bonding semiconductor package.

2. Description of Related Art

A multi-chip semiconductor package usually requires a lead frame with more than one die pad to accommodate the multiple semiconductor chips. The die pads in a lead frame are mutually separated to maintain electrical isolation between different semiconductor chips, which is particular important for vertical semiconductor chips such as vertical metal oxide semiconductor field effect transistors (MOS-FETs) where the drain electrode disposed on the bottom of MOSFET chip is electrically connected to the die pad. The mutually separated die pads are connected to the lead frame with tie bars in a few locations that may not provide adequate support in the wire bonding process, especially with the current trend to replace gold (Au) wires with copper (Cu) wires for cost reduction purposes. Cu wires are much harder and stronger than Au wires and therefore require much stronger force in the wire bonding process. For that reason the integrity of lead frame much improve to sustain the impact of Cu bond wire to achieve high quality electrical connections. On the other hand the leads layout of a certain package must remain the same for the new cost saving device to be adopted onto the same circuit board without costly design modification. An improved lead frame and assembly process are needed to achieve these goals.

BRIEF SUMMARY OF THE INVENTION

The present invention aims at providing an improved lead frame and a corresponding method for making a copper wire bond package by increasing the lead frame integrity to support the copper wire bonding action, therefore improving the product reliability and production efficiency of copper wire bond package.

To realize the above purpose, the present invention provides a lead frame array comprising a plurality of lead frame units therein, each lead frame unit comprises a first die pad and a second die pad each having a plurality of tie bars connected to the lead frame array, a plurality of reinforced bars interconnecting the first and second die pads to provide additional anchor to the die pads therefore improves the integrity and stability of lead frame during Cu wire bonding process.

The present invention further provides a method for making a wire bond package comprising the following steps:

Step 1: providing a lead frame array comprising a plurality of lead frame units therein, wherein each lead frame unit comprises a first die pad and a second die pad each having a plurality of tie bars connected to the lead frame array, and a plurality of reinforced bars interconnecting the first and second die pads;

Step 2: mounting a first and a second semiconductor chip onto the first and second die pads, respectively; electrically connecting a plurality of electrodes on the first and second semiconductor chips via wire bonding to a plurality of leads along the first and second die pads;

Step 3: encapsulating the lead frame unit (10) the chips and the bond wires (50) with a body of molding compound, at least a bottom of the plurality of reinforced bars being exposed through a bottom of the body of molding compound;

Step 4: disconnecting the first and second die pads by removing at least a portion of the reinforced bars from the bottom of the body of molding compound thus electrically isolating the first and second die pads.

In a preferred embodiment, the step of wire bonding in Step 2 further comprises electrically connecting the plurality of electrodes on the first and second semiconductor chips to the plurality of leads along the first and second die pads via Cu wire bonding.

In another embodiment the step of mounting the semiconductor chips and wire bonding in Step 2 further comprising mounting the first semiconductor chip onto the first die pad, electrically connecting an electrode on the first semiconductor chip to a first area of the second die pad via Cu wire bonding, mounting the second semiconductor chip onto a second area of the second die pad, electrically connecting at least an electrode on the second semiconductor chip to a lead around the second die pad.

In one preferred embodiment, the first and second semiconductor chips each comprises a vertical semiconductor chip such as a vertical transistor. In another preferred embodiment the first and second semiconductor chips each comprises a MOSFET chip having a gate and a source electrode disposed on top of the MOSFET chip and a drain electrode disposed on the bottom of the MOSFET chip.

In one embodiment, the step of mounting the first and second semiconductor chips further comprises using a conductive adhesive electrically bonding the drains of the first and second semiconductor chips respectively to the first and second die pads.

In one preferred embodiment, the step of disconnecting the first and second die pads in Step 4 further comprises a step of removing the reinforced bars from the bottom of the body of molding compound by mask etching the reinforced bars.

In another preferred embodiment, the step of disconnecting the first and second die pads in Step 4 further comprises a step of sawing through the reinforced bars from the bottom of the body of molding compound.

In another preferred embodiment, the step of removing at least a portion of the reinforced bars further comprises completely removing the reinforced bars.

These and other objects and advantages of the present invention will no doubt become obvious to those of ordinary skill in the art after having read the following detailed description of the preferred embodiment, which is illustrated in the various drawing figures.

BRIEF DESCRIPTION OF THE SEVERAL VIEWS OF THE DRAWINGS

FIGS. 3A-5A are cross sectional views in A-A direction corresponding to FIGS. 3-5;

DETAILED DESCRIPTION OF THE INVENTION

The present invention is detailed in combination with the drawings and descriptions of the preferred embodiments as follows.

The package structure and its making method provided by the present invention are applicable to various types of semiconductor chips, including FET chips and IC control chips, etc. In the detailed description of the embodiments below, MOSFET chips are taken as example to explain the advantages and favorable effects of the present invention. However, it shall be noted that the description and embodiments do not constitute limitations to the protection scope of the present invention.

Figure 1:
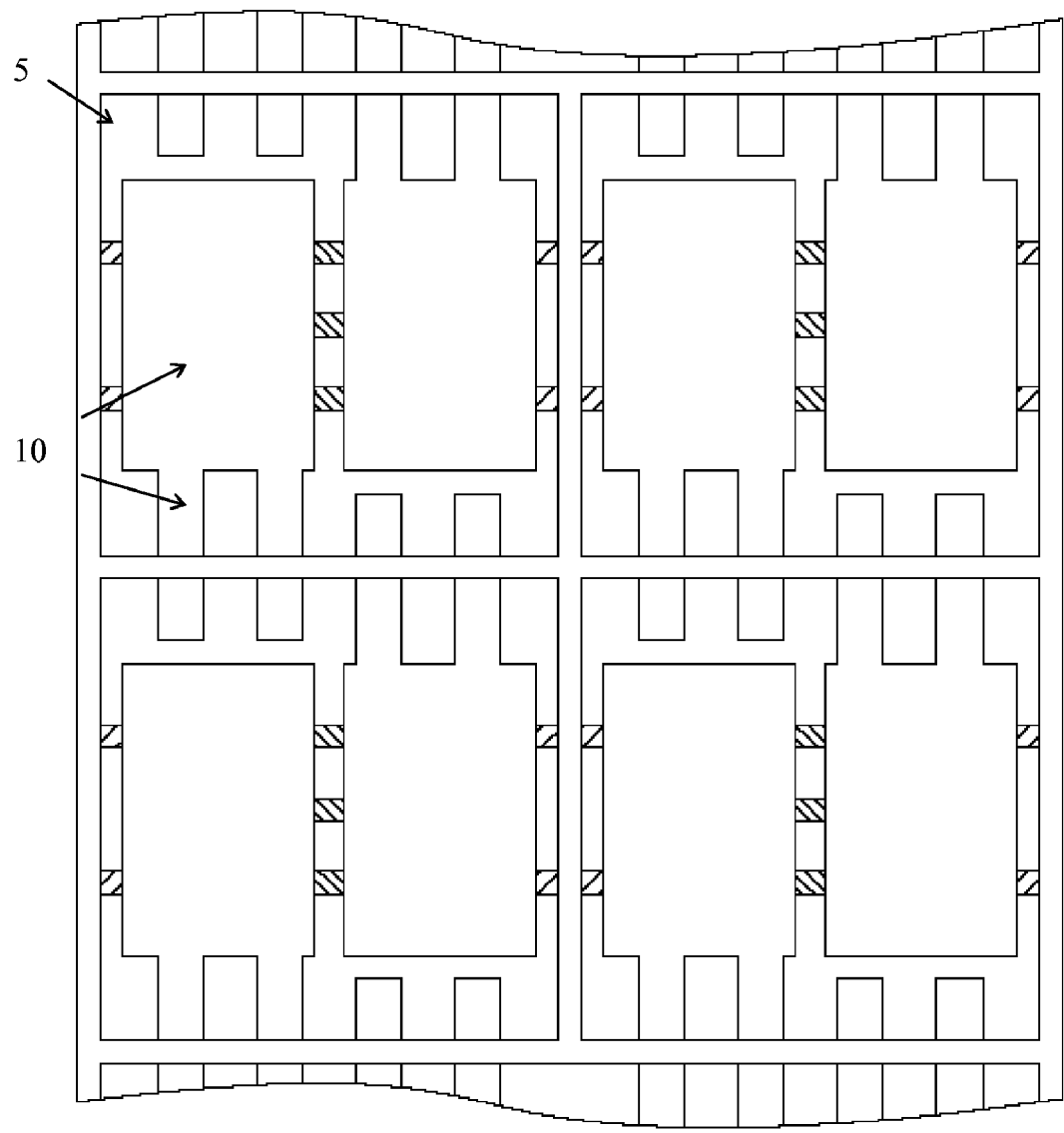
FIG. 1 is a top view of a lead frame array structure according to the present invention.
Figure 2:
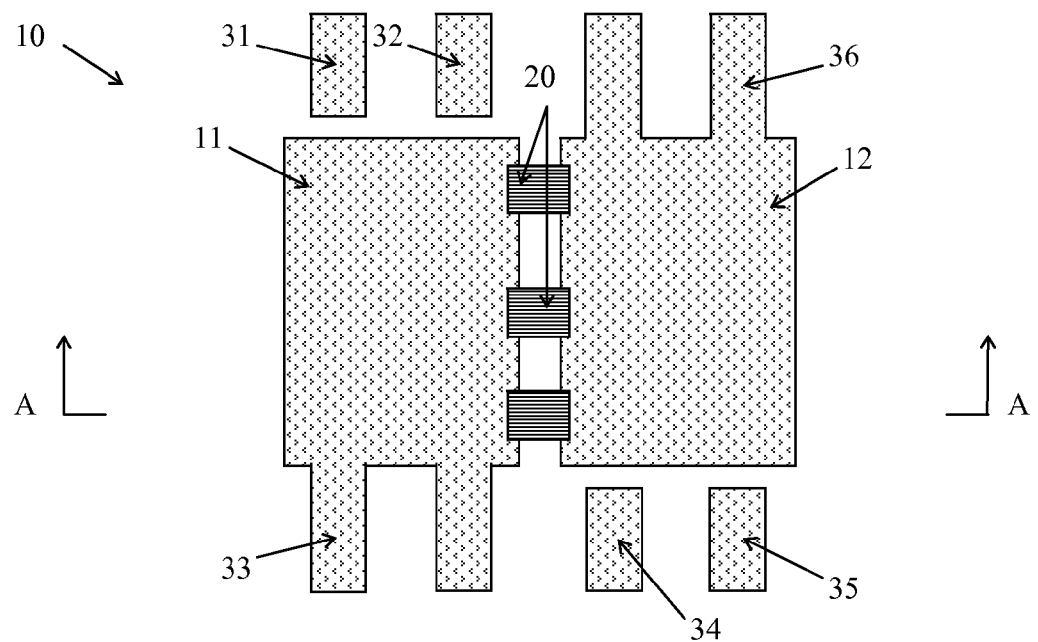
FIG. 2 is a top view of a leaf frame unit of the lead frame array in FIG. 1.
Figure 2A:
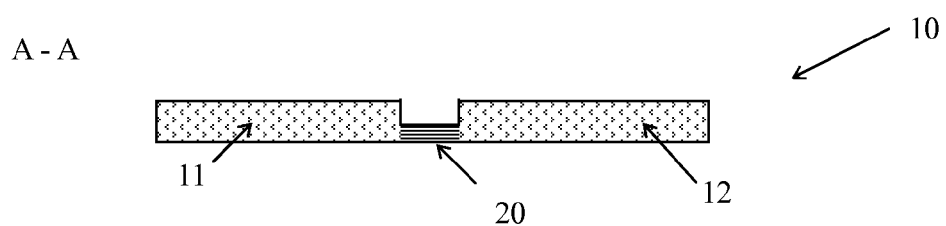
FIG. 2A is a cross sectional view in A-A direction of FIG. 2.

FIG. 1 is a diagram of a lead frame array 5 comprising a plurality of lead frame units 10 according to current invention. FIG. 2 is a top view of the structure of one lead frame unit 10 and FIG. 2A is a cross sectional view of the lead frame unit along A-A line. Each lead frame unit 10 comprises a first die pad 11 and a second die pad 12 on the lead frame 10 for mounting multiple chips with a plurality of pins disposed on two opposite sides of the lead frame 10. Each die pad is connected to the lead frame array via a plurality of tie bars.

As shown in FIGS. 1 and 2, a plurality of spaced apart reinforced bars 20 are provided on the lead frame 10 to interconnect the first and second die pads. The reinforced bars 20 provide addition anchors to both die pads therefore improving the overall integrity and stability of the lead frame 10. As shown in FIG. 2A, the reinforced bars 20 may be formed with a half-etch from a top surface of the lead frame to etch off the upper portion therefore having a bottom surface coplanar to the bottom of the first and second die pads and a top surface recess from a top surface of the first and second die pad. The reinforced bars 20 will be removed from the bottom of the package after encapsulation so as to realize electrical isolation between the first die pad 11 and the second die pad 12.

Figure 3:
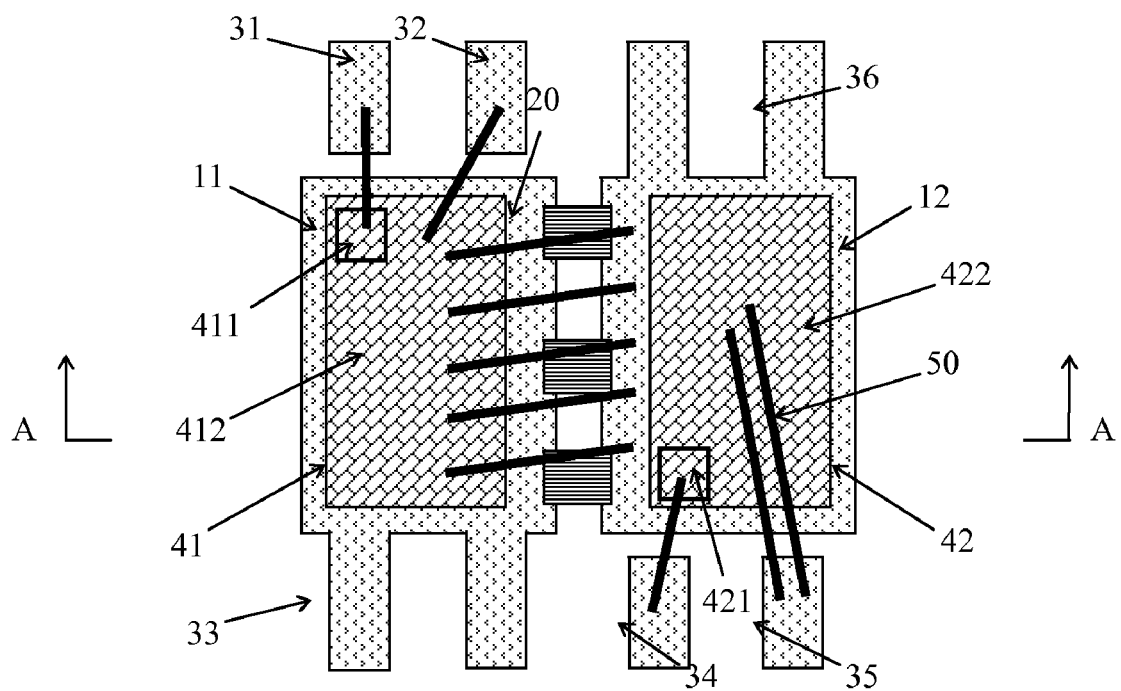
FIGS. 3-5 are top views of package assembly in different steps according to the present invention.
Figure 3A:
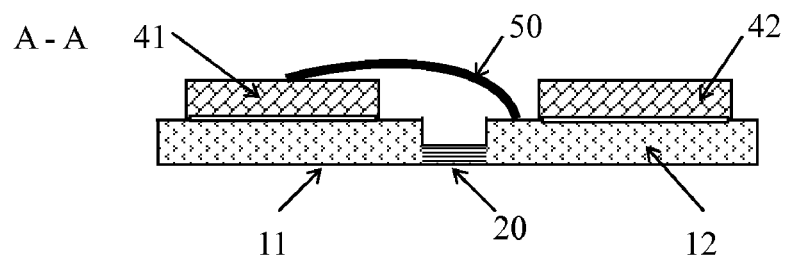

As shown in FIGS. 3 and 3A, two MOSFET chips are mounted on the first and second die pads respectively. The two MOSFETs may be two N type or two P type MOSFET chips, wherein one is a high-side MOSFET chip 41 and the other is a low-side MOSFET chip 42. Both the high-side and low-side MOSFET chips are vertical MOSFET devices with a bottom drain (not shown), a top source electrode 412, 422 respectively and a top gate electrode 411, 421 respectively.

Correspondingly, several pins isolated from the first, second die pads without electrical connection are set on the lead frame 10, comprising a high-side source pin 32, a high-side gate pin 31, a low-side source pin 35 and a low-side gate pin 34; and several pins respectively connecting to the first, second die pads are also set on the lead frame 10, including a high-side drain pin 33 and a low-side drain pin 36.

The high-side gate pin 31, the high-side source pin 32 and the low-side drain pin 36 are on the same side of the lead frame 10; the high-side drain pin 33, low-side gate pin 34 and the low-side source pin 35 are on the opposite side of the lead frame 10.

The high-side MOSFET chip 41 is mounted to the first die pad 11 so as to form an electrical connection between the bottom drain and the first die pad 11 and provide a connection with the external components via the high-side drain pin 33; the top source 412 and the top gate 411 are wire bonded respectively to form an electrical connection with the high-side source pin 32 and the high-side gate pin 31 via bond wires 50. Although Au wires or aluminium (Al) wires may be used, bond wires 50 preferably are Cu wires.

Similarly, the low-side MOSFET chip 42 is mounted to the second die pad 12 so as to form an electrical connection between the bottom drain and the second die pad 12 and further extend the electrical connection to the low-side drain pin 36; the top source 422 and the top gate 421 are wire bonded respectively to form an electrical connection with the low-side source pin 35 and the low-side gate pin 34 via wires 50. Although Au wires or Al wires may be used, bond wires 50 preferably are Cu wires.

The top source 412 of the high-side MOSFET chip 41 is further wire bonded to the second die pad 12 via bond wire 50 to electrically connect the top source 412 of the high-side MOSFET chip 41 and the bottom drain of the low-side MOSFET chip 42. Although Au wires or Al wires may be used, bond wires 50 preferably are Cu wires.

In one embodiment, the high-side and low-side MOSFET chips 41 and 42 are mounted on the first and second die pads 11 and 12 respectively before carry out wire bonding process. In another embodiment, the high-side MOSFET chip 41 is mounted on the first die pad 11 with an electrical conductive adhesive followed by a wire bonding process to connect the top source 412 of the high-side MOSFET to a first area of the second die pad 12; the low-side MOSFET chip 42 is then mounted to a second area of the second die pad 12 with an electrical conductive adhesive followed by another wire bonding process to connect the top source 422 and top gate 421 of the low-side MOSFET 42 to the low-side source pin 35 and the low-side gate pin 34 respectively.

Figure 4:
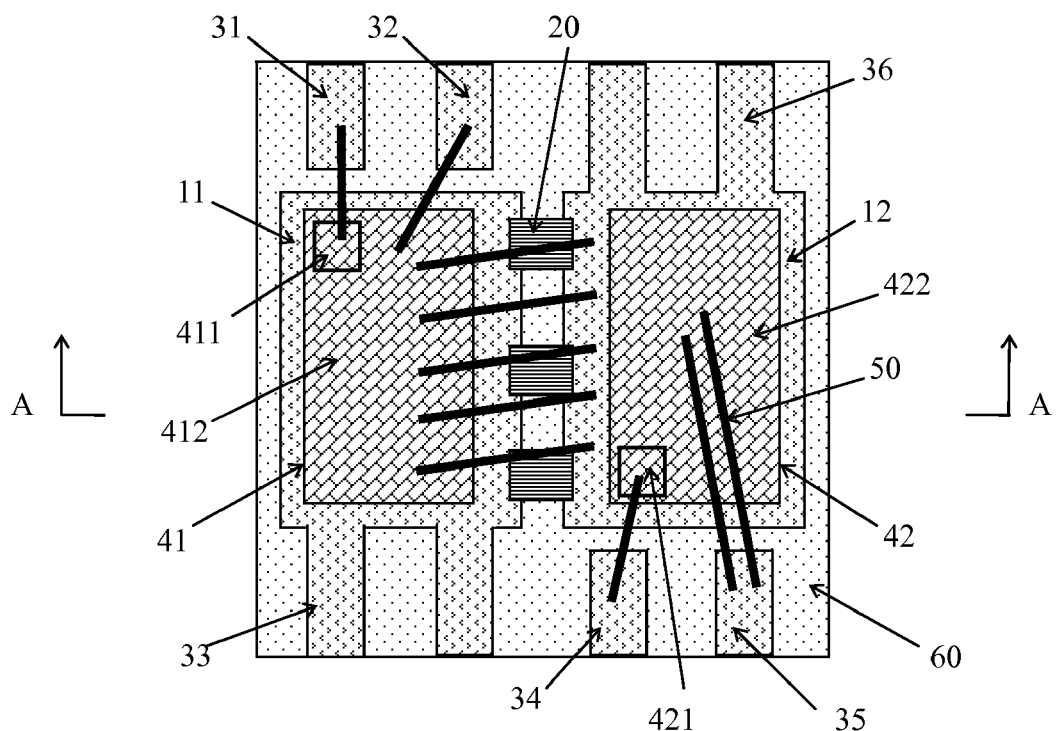
Figure 4A:
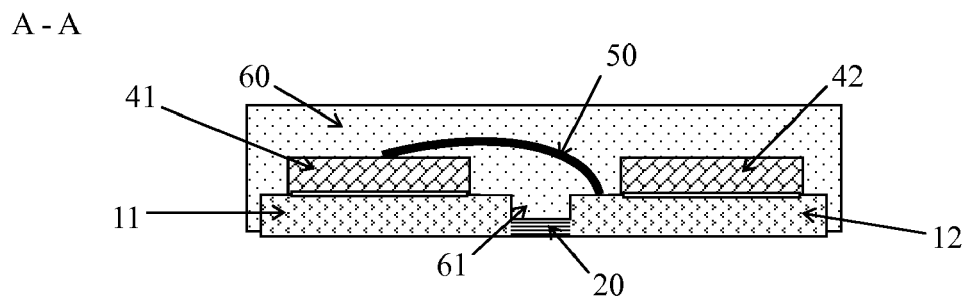
Figure 5:
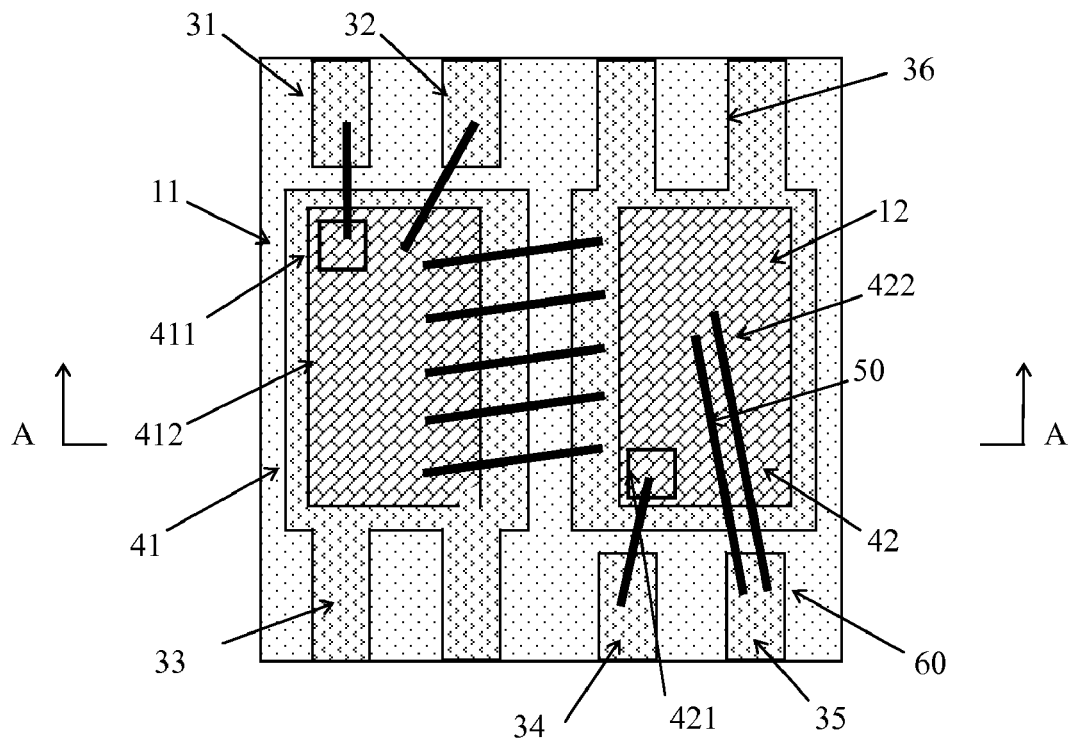

As shown in FIGS. 4 and 4A, a molding process is carry out by applying a molding compound to form a plastic packaging body 60 encapsulating the lead frame 10, the high-side and the low-side MOSFET chips 41 and 42 as well as the bonding wires 50, in such a way that a bottom of the reinforced bars 20 is exposed through the bottom of the plastic packaging body 60. In a preferred embodiment, a bottom of the first and second die pads and the plurality of pins are also exposed through the bottom of the plastic packaging body 60. The reinforced bars 20 are then removed from the bottom of the plastic packaging body 60 to separate the connection between first die pad 11 and the second die pad 12 thus the first die pad 11 and the second die pad 12 are electrically disconnected. A package saw through process is followed to saw through the lead frame array and the molding material to yield individual package as shown in FIGS. 5 and 5A.

Figure 5A:
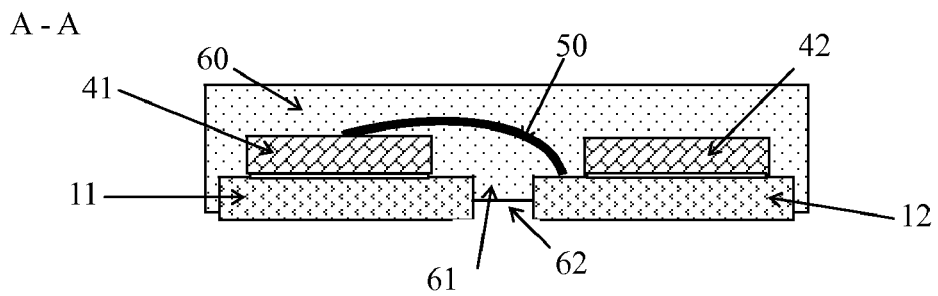

As shown in FIGS. 4A and 5A, the plastic packaging body 60 fills a space 61 above the top surface of the reinforced bars 20 between the first die pad and the second die pad; after the reinforced bars 20 are removed, the plastic packaging body filling the space 61 is reserved, a gap 62 between the first die pad and the second die pad is created to break the electrical connection between the first die pad and the second die pad. In one embodiment a masked etching process is carried out to etch off from the bottom of the plastic packaging body 60 at least a section of each of the reinforced bars 20 for completely breaking the connection between the first die pad 11 and the second die pad 12. In another embodiment, a sawing process is carried out to cut off at least a section of each of the reinforced bars 20 from the bottom of the plastic packaging body 60 to completely break the connection between the first die pad 11 and the second die pad 12.

The method as described above provides a wire bond DFN package comprising: a first die pad 11 and a second die pad 12 on the lead frame 10 for mounting a high-side MOSFET and a low-side MOSFET, a plurality of pins disposed on two opposite sides of the lead frame 10 along the two die pads respectively, In addition to encapsulation of the abovementioned two MOSFET chips, the present invention may further encapsulate an IC control chip mounted on the first or second die pads. The invention is also applicable to any wire bond multiple chip package using lead frame with multiple die pads.

The present invention forms at least one reinforced bar to interconnect the first and second die pads of a lead frame before the completion of encapsulation to improve the overall integrity and stability of the lead frame therefore providing sufficient support to sustain the impact of the copper wire bonding process, thus effectively improving product reliability and production efficiency.

Although the contents of the present invention have been disclosed by the abovementioned preferred embodiments, it shall be noted that the above description shall not be considered as the limitation to the present invention. Many variations and modifications are obvious to those skilled in this art after reading through the abovementioned contents. Therefore, the protection scope of the present invention shall be limited by the claims.

What is claimed is:

1. A method for making a wire bond package comprising the following steps:
    Step 1: providing a lead frame array comprising a plurality of lead frame units therein, wherein each lead frame unit comprises a first die pad and a second die pad each having a plurality of tie bars connected to the lead frame array, and a plurality of reinforced bars extending from the first die pad to the second die pad, a bottom of the reinforced bars being coplanar to a bottom of the first and second die pads;
    Step 2: mounting a first and a second semiconductor chip onto the first and second die pads, respectively; electrically connecting a plurality of electrodes on the first and second semiconductor chips via wire bonding to a plurality of leads along the first and second die pads;
    Step 3: encapsulating the lead frame unit, the first and second semiconductor chips and the bond wires with a single body of molding compound, the body of molding compound filling a space above a top surface of the reinforced bars between the first die pad and the second die pad, at least a bottom of the plurality of reinforced bars being exposed through a bottom of the body of molding compound;
    Step 4: disconnecting the first and second die pads by removing at least a portion of the reinforced bars from the bottom of the body of molding compound die pad thus electrically isolating the first and second die pads.

2. The method for making a wire bond package of claim 1, wherein the step of wire bonding in Step 2 further comprising electrically connecting the plurality of electrodes on the first and second semiconductor chips to the plurality of leads around the first and second die pads via copper (Cu) wire bonding.

3. The method for making a wire bond package of claim 2, wherein the step of mounting the semiconductor chips and wire bonding in Step 2 further comprising mounting the first semiconductor chip onto the first die pad, electrically connecting an electrode on the first semiconductor chip to a first area of the second die pad via Cu wire bonding, mounting the second semiconductor chip onto a second area of the second die pad, electrically connecting at least an electrode on the second semiconductor chip to a lead around the second die pad.

4. The method for making a wire bond package of claim 3, wherein the first and second semiconductor chips each comprises a vertical metal oxide semiconductor field effect transistor (MOSFET) chip having a gate and a source electrode disposed on top of the MOSFET chip and a drain electrode disposed on the bottom of the MOSFET chip.

5. The method for making a wire bond package of claim 4, wherein the step of mounting the first and second semiconductor chips further comprises using a conductive adhesive electrically bonding the drains of the first and second semiconductor chips respectively to the first and second die pads.

6. The method for making a wire bond package of claim 3, wherein the first and second semiconductor chips each comprises a vertical semiconductor chip.

7. The method for making a wire bond package of claim 3, wherein the first and second semiconductor chips each comprises a vertical transistor chip.

8. The method for making a wire bond package of claim 1, wherein the step of disconnecting the first and second die pads in Step 4 further comprising a step of removing the reinforced bars from the bottom of the body of molding compound by mask etching the reinforced bars.

9. The method for making a wire bond package of claim 1, wherein the step of disconnecting the first and second die pads in Step 4 further comprising a step of sawing through the reinforced bars from the bottom of the body of molding compound.

10. The method for making a wire bond package of claim 1, wherein the plurality of reinforced bars interconnecting the first and second die pads are half-etched from a top surface of the lead frame.

11. The method for making a wire bond package of claim 1, wherein the plurality of reinforced bars interconnecting the first and second die pads are spaced apart from each another.

12. The method for making a wire bond package of claim 1, wherein the step of removing at least a portion of the reinforced bars further comprises completely removing the reinforced bars.

* * * * *